US006482705B1

(12) United States Patent
Yu

(10) Patent No.: US 6,482,705 B1
(45) Date of Patent: Nov. 19, 2002

(54) METHOD OF FABRICATING A SEMICONDUCTOR DEVICE HAVING A MOSFET WITH AN AMORPHOUS SIGE GATE ELECTRODE AND AN ELEVATED CRYSTALLINE SIGE SOURCE/DRAIN STRUCTURE AND A DEVICE THEREBY FORMED

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/825,659

(22) Filed: Apr. 3, 2001

(51) Int. Cl.[7] .............................................. H01L 21/336
(52) U.S. Cl. ........................ 438/300; 438/217; 438/301
(58) Field of Search ................................. 438/300, 217

(56) References Cited

U.S. PATENT DOCUMENTS

| 5,155,571 A | * | 10/1992 | Wang et al. ................... 257/19 |
| 5,571,744 A | * | 11/1996 | Demirlioglu et al. ....... 438/217 |
| 5,955,759 A | * | 9/1999 | Ismail et al. ................ 257/332 |
| 6,228,692 B1 | * | 5/2001 | Tsutsu ....................... 438/164 |
| 6,319,799 B1 | * | 11/2001 | Ouyang et al. ............. 438/528 |

OTHER PUBLICATIONS

A. Chatterjee, et. al., CMOS Metal Replacement Gate Transistors Using Tantalum Pentoxide Gate Insulator, IEDM 1998.

* cited by examiner

Primary Examiner—David Nelms
Assistant Examiner—Thao Le
(74) Attorney, Agent, or Firm—LaRiviere, Grubman & Payne, LLP

(57) ABSTRACT

A method of fabricating a semiconductor device, having a MOSFET with an amorphous-silicon-germanium gate electrode and an elevated crystalline silicon-germanium source/drain structure for preventing adverse reaction with an underlying silicon substrate, and a device thereby formed. The gate electrode and the raised S/D structure are simultaneously formed by depositing and polishing an amorphous-silicon-germanium film and subsequently heating the polished an amorphous-silicon-germanium film in a low temperature range. Generally, the method involves: (1) depositing an amorphous-silicon-germanium layer; (2) simultaneously forming a raised source/drain structure and a gate electrode by polishing the amorphous-silicon-germanium layer; and (3) annealing the raised source/drain structure and a gate electrode.

Figure 1:
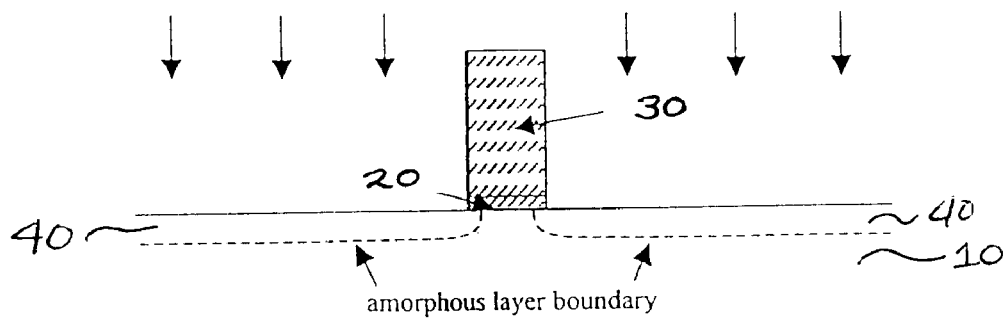

20 Claims, 2 Drawing Sheets junction contour (after dopant activation during solid-phase epitaxy)

METHOD OF FABRICATING A SEMICONDUCTOR DEVICE HAVING A MOSFET WITH AN AMORPHOUS SIGE GATE ELECTRODE AND AN ELEVATED CRYSTALLINE SIGE SOURCE/DRAIN STRUCTURE AND A DEVICE THEREBY FORMED

CROSS-REFERENCE TO RELATED APPLICATION(S)

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

The present invention relates to semiconductor devices and their methods of fabrication. More particularly, the present invention relates to metal oxide semiconductor field effect transistors (MOSFETs) in semiconductor devices. Even more particularly, the present invention relates to semiconductor devices having MOSFETs incorporating silicon-germanium (SiGe) structures.

2. Description of the Background Art

Currently, high dielectric constant (high-k) materials used for gates permit further reduction of gate equivalent oxide thickness (EOT) without significant tunneling leakage current as would, otherwise, occur in a conventional gate using silicon dioxide ($SiO_2$) as a gate oxide. However, most high-k materials will react with a silicon substrate in a temperature range of $\geq 750°$ C. Thus, the semiconductor industry has an ongoing interest in improving the post-gate-fabrication process. A conventional related art gate electrode is formed from polysilicon (poly-Si) and has several disadvantages: (1) a non-adjustable work function that is unsuitable for threshold voltage design of a MOSFET being formed on a thin-film fully-depleted undoped-channel, (2) a low dopant activation rate, (3) an inferior suppression of boron (B) diffusion in a $p^+$-type gate. Related art raised source/drain (r-c-S/D) structures are formed by epitaxial techniques and have the following disadvantages: (1) a high deep S/D junction series resistance, and (2) insufficient space for forming a thick silicidation, thereby maintaining a high S/D series resistance. Further, the conventional poly-Si epitaxial technique involves high temperature processing in a range of 1100° C. to 1200° C., which introduces additional and undue thermal budget to the MOSFET. This condition is not preferred in terms of the formation of a steep retrograde well and an ultra-shallow S/D extension junction. Therefore, a need is seen to exist for a method of fabricating a semiconductor device, having a MOSFET incorporating an alternative structure for preventing reaction with an underlying silicon substrate, and a device thereby formed.

BRIEF SUMMARY OF THE INVENTION

Accordingly, the present invention provides a method of fabricating a semiconductor device, having a MOSFET incorporating a distinct structure for preventing reaction with an underlying silicon substrate, as well as a device thereby formed. The present invention device comprises a MOSFET having an amorphous-silicon-germanium ($\alpha$-SiGe) gate electrode and an elevated crystalline silicon-germanium (c-SiGe) source/drain structure. An $\alpha$-SiGe gate electrode has several advantages over the related art polysilicon (poly-Si) gate electrodes: (1) an adjustable work function that is suitable for threshold voltage design for a MOSFET being formed on a thin-film fully-depleted undoped-channel MOSFET, (2) a higher dopant activation rate, (3) a superior suppression of boron (B) diffusion (i.e., penetration) in a $p^+$-type gate. A gate electrode formed from $\alpha$-SiGe also streamlines the fabrication process in that the present invention $\alpha$-SiGe material requires simple processing, in contrast to related art refractory metal gates electrodes. A raised c-SiGe source/drain (r-c-S/D) structure is extremely useful in ultra-large scale integration (ULSI) MOSFETs as it provides the following advantages: (1) a reduced deep S/D junction series resistance, and (2) more space for a thicker silicidation, thereby reducing S/D series resistance.

By way of example, and not of limitation, a semiconductor device, having a MOSFET with an amorphous-silicon-germanium ($\alpha$-SiGe) gate electrode and an elevated crystalline silicon-germanium (c-SiGe) source/drain structure is generally fabricated according to the present invention by simultaneously depositing and polishing an $\alpha$-SiGe film and subsequently heating the polished $\alpha$-SiGe film in a temperature range of approximately $\leq 600°$ C., preferably in a range of approximately 550° C. to approximately 550° C. Also byway of example, the present invention device may also be fabricated by: (1) depositing an $\alpha$-SiGe layer; (2) simultaneously forming a raised $\alpha$-SiGe source/drain structure and a $\alpha$-SiGe gate electrode by polishing the $\alpha$-SiGe layer; and (3) annealing the raised $\alpha$-SiGe source/drain structure and the $\alpha$-SiGe gate electrode in a temperature range of approximately 550° C. to approximately 600° C. in a heating chamber such as an annealing furnace, and using a technique such as solid-phase epitaxy, thereby forming the $\alpha$-SiGe gate electrode and the raised c-SiGe source/drain structure.

Advantages of the present invention include, but are not limited to, preventing a high deep S/D junction series resistance and providing sufficient space for forming a thick silicidation as well as an alternative structure for preventing reaction with an underlying silicon substrate. Further advantages of the invention will be brought out in the following portions of the specification, wherein the detailed description is for the purpose of fully disclosing preferred embodiments of the invention without placing limitations thereon.

BRIEF DESCRIPTION OF THE DRAWING(S)

For a better understanding of the present invention, reference is made to the below-referenced accompanying Drawing of which the several figures are for illustrative purposes and where like reference numbers denote like elements. FIG. 1 through FIG. 6, together, constitute a process flow diagram of the fabrication of a semiconductor device, in accordance with the present invention, wherein the semiconductor device is shown in cross-section at various stages of the process.

DETAILED DESCRIPTION OF THE INVENTION

Referring more specifically to the drawings for illustrative purposes, the present invention is embodied in the apparatus and method generally shown in FIG. 1 through FIG. 6. These figures depict an embodiment of a process for fabricating a semiconductor device having a MOSFET having an amorphous-silicon-germanium (α-SiGe) gate electrode and an elevated crystalline silicon-germanium (c-SiGe) source/drain structure for preventing reaction with an underlying silicon substrate. Each figure illustrates a particular processing stage, and presents a side view in cross-section of the device at that stage of processing. However, that the apparatus may vary as to configuration and as to details of the parts, and that the method may vary as to the specific steps and sequence, without departing from the basic concepts as disclosed herein, will be appreciated.

Referring first to FIG. 1, in the first stage of processing, a silicon substrate 10 is provided; a thin high dielectric constant (high-k) material film is deposited on the substrate 10; a photoresist layer is deposited on the thin high-k material film; the photoresist layer is lithographically patterned, thereby forming a gate dielectric 20 and a patterned photoresist layer 30, wherein the pattern width may be in a range of approximately 20 nm to approximately 200 nm; and a source/drain region is both amorphized and doped in the substrate 10, thereby forming an amorphized doped source/drain region 40, wherein the amorphizing may be performed by implanting an amorphizer selected from a group consisting essentially of silicon (Si), germanium (Ge), and xenon (Xe), and wherein the doping maybe performed by implanting a dopant selected from a group consisting essentially of boron (B) for a p-channel FET, boron difluoride ($BF_2$) for a p-channel FET, arsenic (As) for an n-channel FET, and phosphorous (P) for an n-channel FET.

Figure 2:
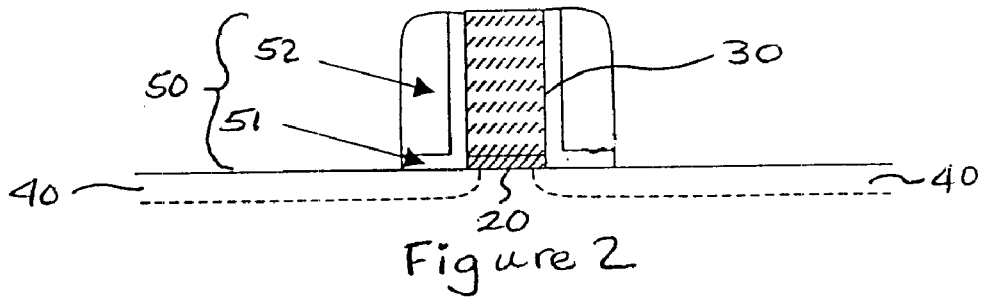

Next, as shown in FIG. 2, at least one spacer 50 is formed on at least one sidewall of the photoresist 30 and on at least one sidewall of the gate dielectric 20, and at least one exposed portion of the substrate 10, each at least one spacer 50 comprising a liner 51 formed on at least one sidewall of the gate dielectric 20, at least one sidewall of the patterned photoresist layer 30, and a portion of the amorphized doped source/drain region 40, the liner 51 formed from a material such as silicon dioxide ($SiO_2$), and a spacer body 52 formed on the liner 51, the spacer body 52 formed from a material such as silicon nitride ($Si_3N_4$), wherein the spacer 50 is formed in a low temperature range, such as approximately <400° C., to prevent premature recrystallization of the silicon, the dopant, and the amorphizer in the amorphized doped source/drain region 40.

Figure 3:
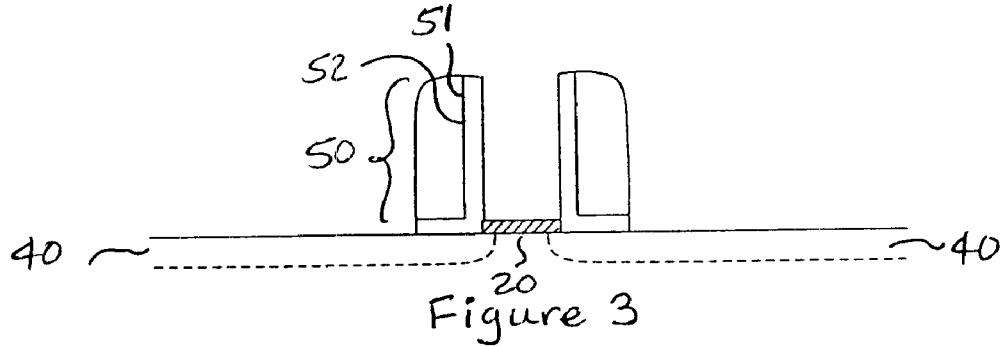

Next, as shown in FIG. 3, the photoresist layer 30 is removed by a technique such as wet chemistry, thereby leaving the gate dielectric 20 and the at least one spacer 50.

Figure 4:
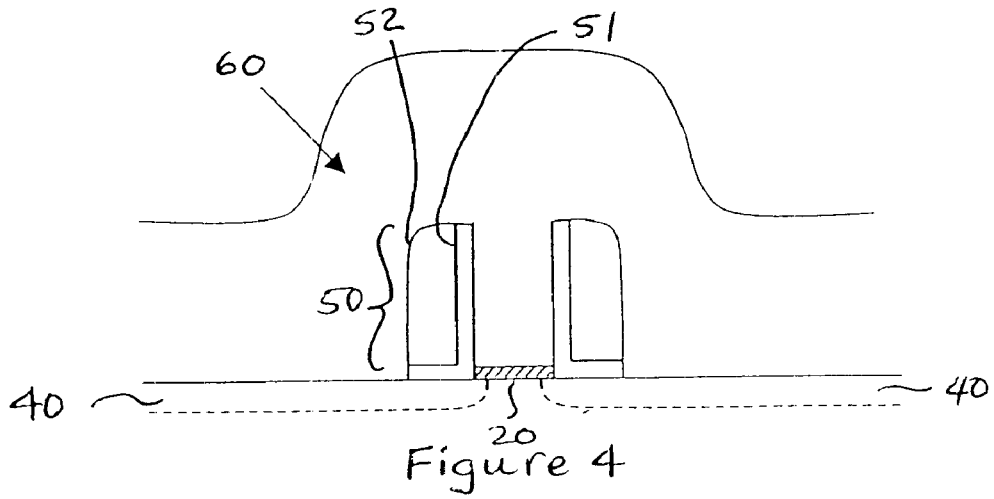

Next, as shown in FIG. 4, a thick doped α-SiGe film 60 is deposited, in-situ, on the at least one spacer 50, the gate dielectric 20, and any exposed portions of the substrate 10, the film 60 having a high thickness range, such as approximately 2000 Angstroms to approximately 5000 Angstroms, and being deposited in a low temperature range, such as approximately <450° C.

Figure 5:
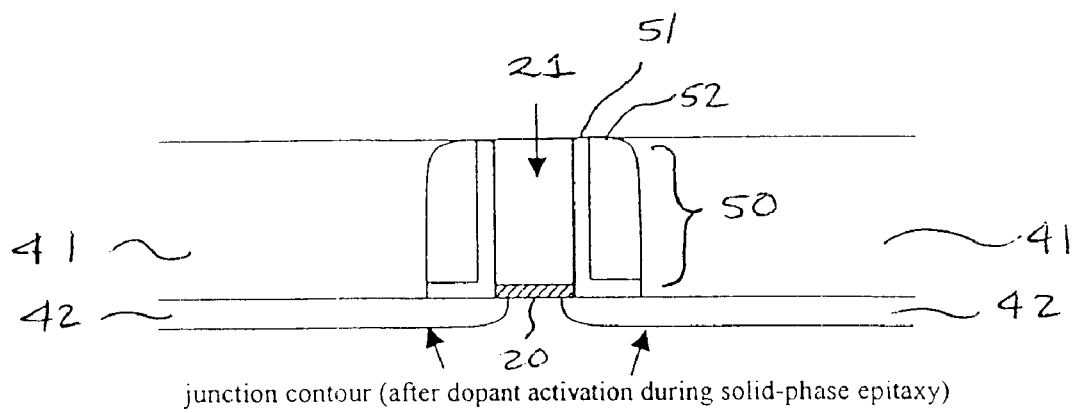

Next, as shown in FIG. 5, an α-SiGe gate electrode 21 and an α-SiGe raised source/drain structure are simultaneously formed by chemically-mechanically-polishing the thick in-situ doped α-SiGe film 60, whereby the spacer 50 is exposed; and a c-SiGe raised source/drain structure 41 and a source/drain junction 42 are simultaneously formed by annealing the chemically-mechanically-polished thick in-situ doped α-SiGe film 60 and the amorphized doped source/drain region 40 in a low temperature range, such as approximately 550° C. to approximately 600° C., for simultaneously crystallizing the α-SiGe in the r-S/D structure 41, whereby solid-phase epitaxy occurs, thereby forming the raised c-SiGe S/D structure and activating the dopant in the amorphized doped source/drain region 40, thereby forming the source/drain junction 42.

Figure 6:
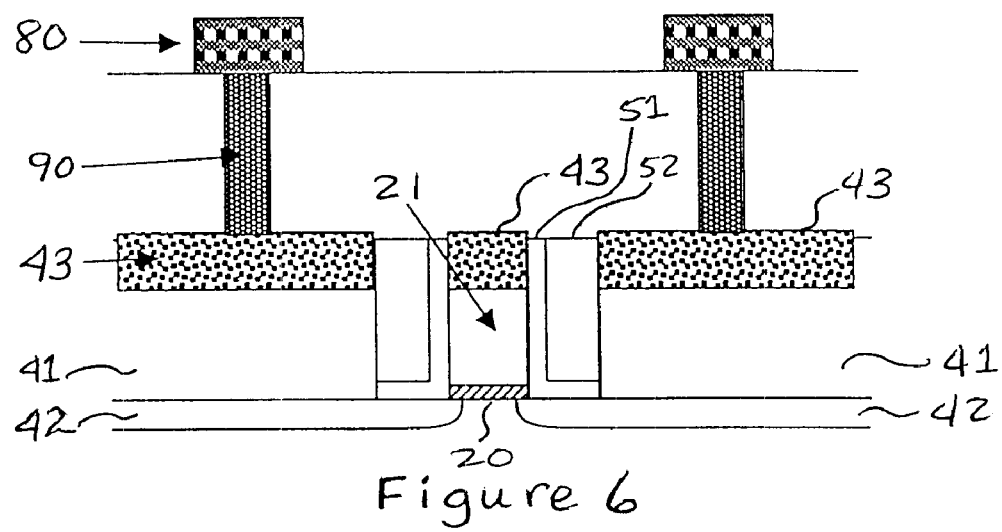
Figure 1:
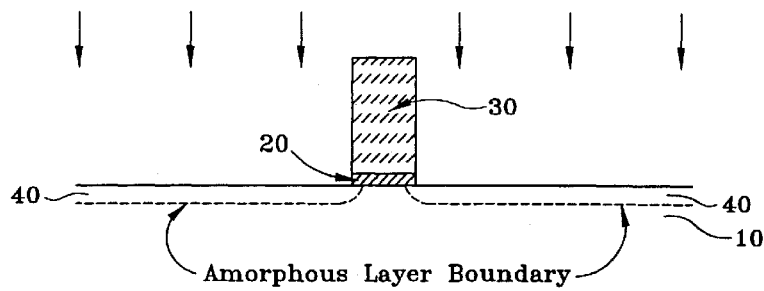
Figure 2:
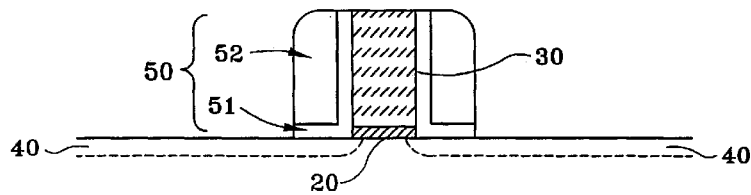
Figure 3:
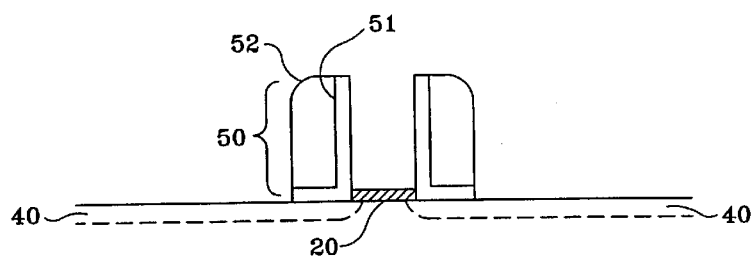
Figure 4:
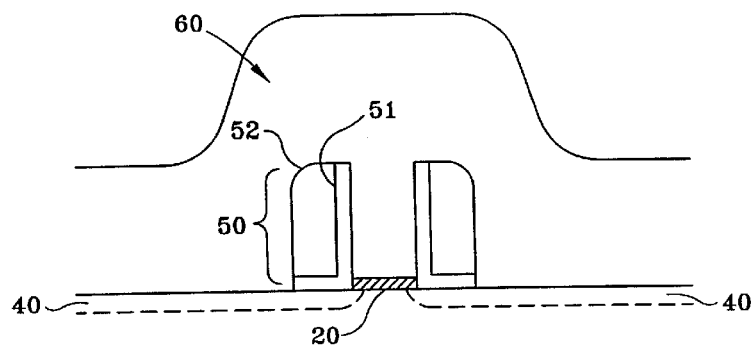
Figure 5:
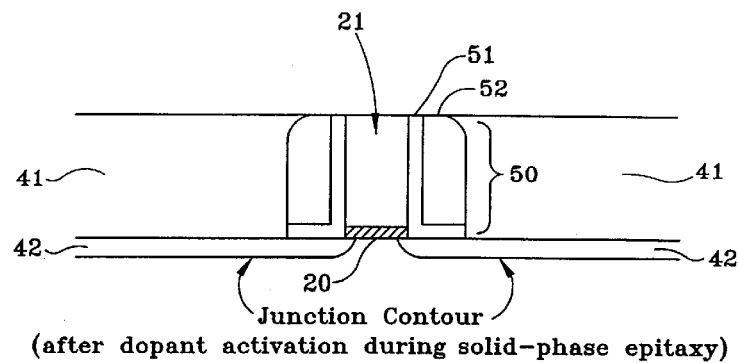
Figure 6:
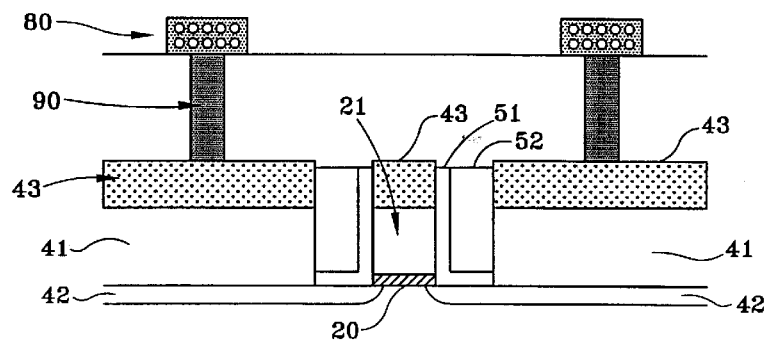

As depicted in FIG. 6, fabrication of the device is completed, wherein an upper region of the c-SiGe raised source/drain structure 41 and an upper region of the gate electrode 21 are silicidized in a low temperature range, such as approximately 400° C. to 800° C., forming at least one interconnect 80; and forming at least one contact 90, the at least one contact 90 being electrically coupling the at least one interconnect 80 to the at least one low-temperature silicidized region 43, wherein the silicidized region 43 may is formed from at least one refractory material selected from a group consisting essentially of tungsten (W), titanium (Ti), molybdenum (Mo), and titanium nitride (TiN), wherein the at least one interconnect 80 may is formed from at least one metal selected from a group consisting essentially of aluminum (Al) and copper (Cu).

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail maybe made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A method of fabricating a semiconductor device, having an amorphous-silicon-germanium (α-SiGe) gate electrode and a raised crystalline silicon-germanium (c-SiGe) source/drain structure, comprising:

depositing an amorphous silicon-germanium (α-SiGe) layer on a gate dielectric, at least one spacer, and at least one exposed portion of a substrate;

polishing the α-SiGe layer, thereby forming an α-SiGe raised source/drain (S/D) structure and an α-SiGe gate electrode;

annealing the α-SiGe raised S/D structure under solid-phase epitaxy in a low temperature range of approximately 500° C. to approximately 550° C., thereby recrystallizing the α-SiGe raised S/D structure, and thereby forming a raised c-SiGe S/D structure; and completing fabrication of the device.

2. A method, as recited in claim 1, further comprising forming a gate dielectric and a patterned photoresist layer.

3. A method, as recited in claim 2, wherein said gate dielectric and said patterned photoresist layer are formed by:

depositing a dielectric material film on the substrate;

depositing a photoresist layer on the dielectric material film; and lithographically patterning the photoresist layer.

4. A method, as recited in claim 1, further comprising amorphizing and doping a source/drain region in the substrate, respectively with an amorphizer and a dopant, thereby forming an amorphized doped source/drain region.

5. A method, as recited in claim 1, wherein said at least one spacer is formed on at least one sidewall of the gate dielectric, at least one sidewall of the patterned photoresist layer, and a portion of the amorphized doped source/drain region.

6. A method, as recited in claim 2, further comprising removing the photoresist layer, thereby leaving the gate dielectric and the at least one spacer.

7. A method, as recited in claim 1, wherein said α-SiGe gate electrode and said raised α-SiGe source/drain structure are simultaneously formed from the thick doped amorphous-SiGe film.

8. A method, as recited in claim 1, wherein a raised c-SiGe source/drain structure and a source/drain junction are simultaneously formed by respectively annealing the raised α-SiGe source/drain structure and the amorphized doped source/drain region.

9. A method, as recited in claim 1,
wherein the thick doped α-SiGe film comprises a high thickness range of approximately 2000 Angstroms to approximately 5000 Angstroms, and
wherein the thick doped α-SiGe film is deposited in a low temperature range of approximately 300° C. to approximately 450° C.

10. A method, as recited in claim 1, wherein the respective annealing step is performed in a low temperature range of approximately 550° C. to approximately 600° C. for simultaneously crystallizing the raised α-SiGe source/drain structure, whereby solid-phase epitaxy occurs, thereby forming the raised c-SiGe source/drain structure, and activating the dopant in the amorphized doped source/drain region, thereby forming the source/drain junction.

11. A method of fabricating a semiconductor device, having an amorphous-silicon-germanium (α-SiGe) gate electrode and a raised crystalline silicon-germanium (c-SiGe) source/drain structure, comprising:

forming a gate dielectric and a patterned photoresist layer;

depositing an amorphous silicon-germanium (α-SiGe) layer on said gate dielectric, at least one spacer, and at least one exposed portion of a substrate;

polishing the α-SiGe layer, thereby forming an α-SiGe raised source/drain (S/D) structure and an α-SiGe gate electrode;

annealing the α-SiGe raised S/D structure under solid-phase epitaxy in a low temperature range of approximately 500° C. to approximately 550° C., thereby recrystallizing the α-SiGe raised S/D structure, and thereby forming a raised c-SiGe S/D structure; and completing fabrication of the device in a low temperature range of approximately 500° C. to approximately 550° C.

12. A method, as recited in claim 11, wherein said gate dielectric and said patterned photoresist layer are formed by:

depositing a dielectric material film on the substrate;

depositing a photoresist layer on the dielectric material film; and lithographically patterning the photoresist layer.

13. A method, as recited in claim 12, further comprising amorphizing and doping a source/drain region in the substrate, respectively with an amorphizer and a dopant, thereby forming an amorphized doped source/drain region.

14. A method, as recited in claim 13, wherein said at least one spacer is formed on at least one sidewall of the gate dielectric, at least one sidewall of the patterned photoresist layer, and a portion of the amorphized doped source/drain region.

15. A method, as recited in claim 14, further comprising removing the photoresist layer, thereby leaving the gate dielectric and the at least one spacer.

16. A method, as recited in claim 15, wherein said α-SiGe gate electrode and said raised α-SiGe source/drain structure are simultaneously formed from the thick doped amorphous-SiGe film.

17. A method, as recited in claim 16, wherein a raised c-SiGe source/drain structure and a source/drain junction are simultaneously formed by respectively annealing the raised α-SiGe source/drain structure and the amorphized doped source/drain region.

18. A method, as recited in claim 17,
wherein the thick doped α-SiGe film comprises a high thickness range of approximately 2000 Angstroms to approximately 5000 Angstroms, and
wherein the thick doped α-SiGe film is deposited in a low temperature range of approximately 300° C. to approximately 450° C.

19. A method, as recited in claim 18, wherein the respective annealing step is performed in a low temperature range of approximately 550° C. to approximately 600° C. for simultaneously crystallizing the raised α-SiGe source/drain structure, whereby solid-phase epitaxy occurs, thereby forming the raised c-SiGe source/drain structure, and activating the dopant in the amorphized doped source/drain region, thereby forming the source/drain junction.

20. A method of fabricating a semiconductor device, having an amorphous-silicon-germanium (α-SiGe) gate electrode and a raised crystalline silicon-germanium (c-SiGe) source/drain structure, comprising:

depositing an amorphous silicon-germanium (α-SiGe) layer on a gate dielectric, at least one spacer, and at least one exposed portion of a substrate;

polishing the α-SiGe layer, thereby forming an α-SiGe raised source/drain (S/D) structure and an α-SiGe gate electrode;

annealing the α-SiGe raised S/D structure under solid-phase epitaxy in a low temperature range of approximately 500° C. to approximately 550° C., thereby recrystallizing the α-SiGe raised S/D structure, and thereby forming a raised c-SiGe S/D structure;

amorphizing and doping a source/drain region in the substrate, respectively with an amorphizer and a dopant, thereby forming an amorphized doped source/drain region;

forming a gate dielectric and a patterned photoresist layer;

removing the photoresist layer, thereby leaving the gate dielectric and the at least one spacer; and completing fabrication of the device in a low temperature range of approximately 500° C. to approximately 550° C., wherein said gate dielectric and said patterned photoresist layer are formed by:
depositing a dielectric material film on the substrate;
depositing a photoresist layer on the dielectric material film; and
lithographically patterning the photoresist layer, wherein said at least one spacer is formed on at least one sidewall of the gate dielectric, at least one sidewall of the patterned photoresist layer, and a portion of the amorphized doped source/drain region, wherein said α-SiGe gate electrode and said raised α-SiGe source/drain structure are simultaneously formed from the thick doped amorphous-SiGe film, wherein a raised c-SiGe source/drain structure and a source/drain junction are simultaneously formed by respectively annealing the raised α-SiGe source/drain structure and the amorphized doped source/drain region, wherein the thick doped α-SiGe film comprises a high thickness range of approximately 2000 Angstroms to approximately 5000 Angstroms, wherein the thick doped α-SiGe film is deposited in a low temperature range of approximately 300° C. to approximately 450° C., and wherein the annealing step is performed in a low temperature range of approximately 550° C. to approximately 600° C. for simultaneously crystallizing the raised α-SiGe source/drain structure, whereby solid-phase epitaxy occurs, thereby forming the raised c-SiGe source/drain structure, and activating the dopant in the amorphized doped source/drain region, thereby forming the source/drain junction.

* * * * *

UNITED STATES PATENT AND TRADEMARK OFFICE
CERTIFICATE OF CORRECTION

PATENT NO. : 6,482,705 B1
DATED : November 19, 2002
INVENTOR(S) : Bin Yu

It is certified that error appears in the above-identified patent and that said Letters Patent is hereby corrected as shown below:

Title page should be deleted and substitute therefore the attached title page.

Drawings,
Delete Drawing Sheets 1-6, and substitute therefore Drawing Sheets, consisting of Figs. 1-6, as shown on the attached pages.

Signed and Sealed this

First Day of July, 2003

JAMES E. ROGAN
*Director of the United States Patent and Trademark Office*

United States Patent
Yu

(10) Patent No.: US 6,482,705 B1
(45) Date of Patent: Nov. 19, 2002

(54) METHOD OF FABRICATING A SEMICONDUCTOR DEVICE HAVING A MOSFET WITH AN AMORPHOUS SIGE GATE ELECTRODE AND AN ELEVATED CRYSTALLINE SIGE SOURCE/DRAIN STRUCTURE AND A DEVICE THEREBY FORMED

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/825,659

(22) Filed: Apr. 3, 2001

(51) Int. Cl.[7] .............................................. H01L 21/336
(52) U.S. Cl. ........................ 438/300; 438/217; 438/301
(58) Field of Search ..................................... 438/300, 217

(56) References Cited

U.S. PATENT DOCUMENTS

| | | | |
|---|---|---|---|
| 5,155,571 A | * | 10/1992 | Wang et al. .................... 257/19 |
| 5,571,744 A | * | 11/1996 | Demirlioglu et al. ........ 438/217 |
| 5,955,759 A | * | 9/1999 | Ismail et al. ................. 257/332 |
| 6,228,692 B1 | * | 5/2001 | Tsutsu ......................... 438/164 |
| 6,319,799 B1 | * | 11/2001 | Ouyang et al. .............. 438/528 |

OTHER PUBLICATIONS

A. Chatterjee, et. al., CMOS Metal Replacement Gate Transistors Using Tantalum Pentoxide Gate Insulator, IEDM 1998.

* cited by examiner

*Primary Examiner*—David Nelms
*Assistant Examiner*—Thao Le
(74) *Attorney, Agent, or Firm*—LaRiviere, Grubman & Payne, LLP

(57) ABSTRACT

A method of fabricating a semiconductor device, having a MOSFET with an amorphous-silicon-germanium gate electrode and an elevated crystalline silicon-germanium source/drain structure for preventing adverse reaction with an underlying silicon substrate, and a device thereby formed. The gate electrode and the raised S/D structure are simultaneously formed by depositing and polishing an amorphous-silicon-germanium film and subsequently heating the polished an amorphous-silicon-germanium film in a low temperature range. Generally, the method involves: (1) depositing an amorphous-silicon-germanium layer; (2) simultaneously forming a raised source/drain structure and a gate electrode by polishing the amorphous-silicon-germanium layer; and (3) annealing the raised source/drain structure and a gate electrode.

20 Claims, 2 Drawing Sheets

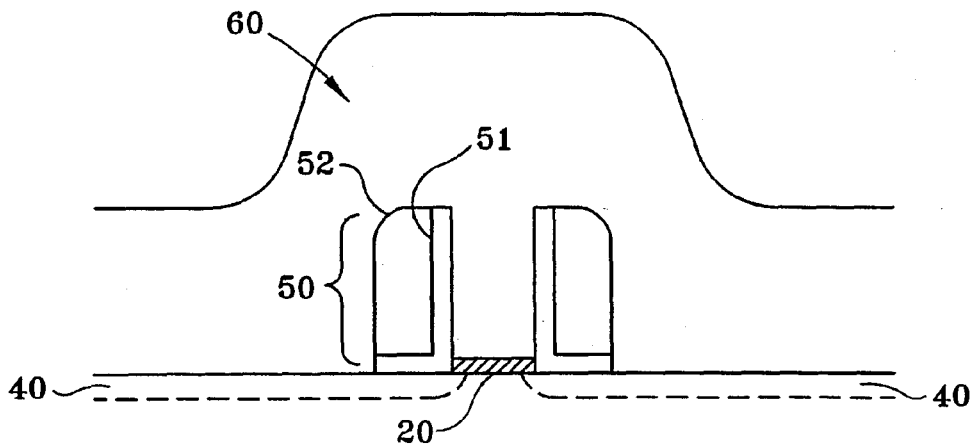

(after dopant activation during solid-phase epitaxy)